(12) United States Patent
Choi et al.

(10) Patent No.: US 9,460,005 B2
(45) Date of Patent: Oct. 4, 2016

(54) STORAGE DEVICES INCLUDING MEMORY DEVICE AND METHODS OF OPERATING THE SAME

(71) Applicant: Samsung Electronics Co., Ltd., Suwon-si (KR)

(72) Inventors: Hong-Suk Choi, Suwon-si (KR); Su-Ryun Lee, Suwon-si (KR); Chun-Um Kong, Seoul (KR); Youn-Won Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 297 days.

(21) Appl. No.: 14/096,491

(22) Filed: Dec. 4, 2013

(65) Prior Publication Data

US 2014/0156918 A1   Jun. 5, 2014

(30) Foreign Application Priority Data

Dec. 4, 2012   (KR) ........................ 10-2012-0139671

(51) Int. Cl.
*G06F 12/02*   (2006.01)
*G11C 11/56*   (2006.01)

(52) U.S. Cl.
CPC ........ *G06F 12/0246* (2013.01); *G11C 11/5628* (2013.01); *G11C 2211/5646* (2013.01); *G11C 2211/5648* (2013.01)

(58) Field of Classification Search
None
See application file for complete search history.

(56) References Cited

U.S. PATENT DOCUMENTS

| | | | |
|---|---|---|---|
| 7,594,157 B2 | 9/2009 | Choi et al. | |
| 7,755,950 B2 | 7/2010 | Yu et al. | |
| 2005/0201177 A1 | 9/2005 | Shiraishi et al. | |
| 2008/0266948 A1* | 10/2008 | Jang | G11C 11/5628 365/185.03 |
| 2009/0059662 A1* | 3/2009 | Woo | G11C 16/10 365/185.03 |

FOREIGN PATENT DOCUMENTS

| | | |
|---|---|---|
| JP | 11-353241 | 12/1999 |
| JP | 2007-323377 | 12/2007 |
| KR | 1020040080436 | 9/2004 |
| KR | 1020070087557 | 8/2007 |
| KR | 1020070096494 | 10/2007 |
| KR | 1020080035353 | 4/2008 |
| KR | 1020080069822 | 7/2008 |
| KR | 1020080097646 | 11/2008 |
| KR | 1020080104815 | 12/2008 |
| KR | 1020090002812 | 1/2009 |
| KR | 1020090020995 | 2/2009 |

* cited by examiner

*Primary Examiner* — Denise Tran
(74) *Attorney, Agent, or Firm* — Myers Bigel & Sibley, P.A.

(57) ABSTRACT

Storage devices including a memory device and methods of operating the storage devices are provided. The storage devices may include a controller which is configured to program first bit data and second bit data paired with the first bit data into a memory device. The first bit data may be less significant bit data than the second bit data. The controller may be configured to selectively perform or skip backup of the first bit data when programming the second bit data.

16 Claims, 13 Drawing Sheets

FIG. 14
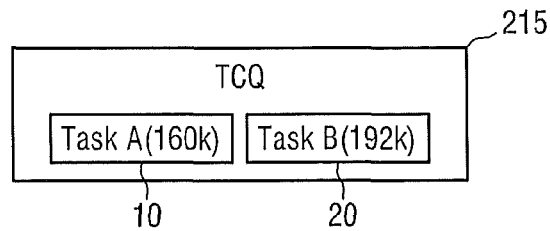
FIG. 15
| Task Tag | Backup Skip Count | Last Confirm Flag | Start Sequence Number |
|---|---|---|---|
| A | 0 | 1 | 100 |
| B | 0 | 1 | 100 |
FIG. 16
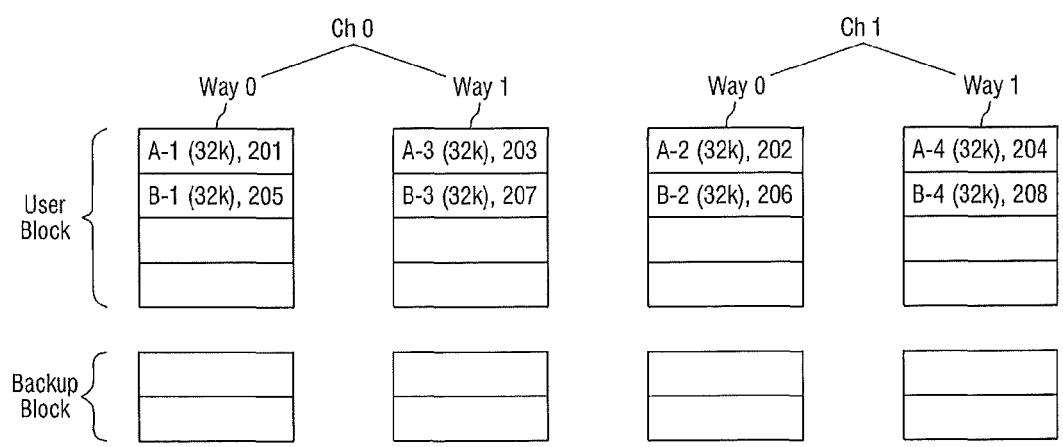

| Task Tag | Backup Skip Count | Last Confirm Flag | Start Sequence Number |
|---|---|---|---|
| A | 0 | 0 | 201 |
| B | 0 | 0 | 205 |

| Task Tag | Backup Skip Count | Last Confirm Flag | Start Sequence Number |
|---|---|---|---|
| A | 3 | 0 | 201 |
| B | 0 | 0 | 205 |

FIG. 20
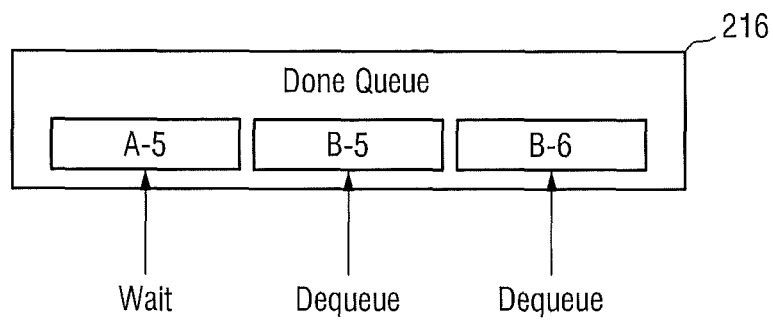
FIG. 21
| Task Tag | Backup Skip Count | Last Confirm Flag | Start Sequence Number |
|---|---|---|---|
| A | 1 | 0 | 201 |
| B | 0 | 1 | 211 |
FIG. 22
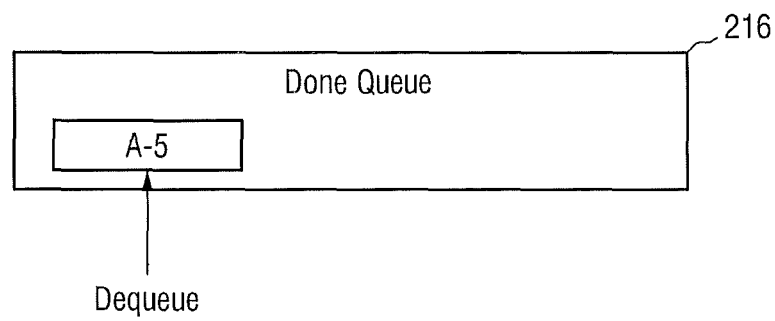

FIG. 23

| Task Tag | Backup Skip Count | Last Confirm Flag | Start Sequence Number |
|---|---|---|---|
| A | 0 | 1 | 210 |
| B | 0 | 1 | 211 |

STORAGE DEVICES INCLUDING MEMORY DEVICE AND METHODS OF OPERATING THE SAME

CROSS-REFERENCE TO RELATED APPLICATION

This U.S. non-provisional application claims priority under 35 U.S.C. §119 to Korean Patent Application No. 10-2012-0139671, filed on Dec. 4, 2012, in the Korean Intellectual Property Office, the disclosure of which is hereby incorporated by reference in its entirety.

FIELD

The present disclosure generally relates to the field of electronics, and more particularly storage devices.

BACKGROUND

Storage devices may be used in various forms. For example, the storage devices may be used in the form of memory cards such as a secure digital (SD) card, a multi-media card (MMC), an extreme digital (xD) card, a compact flash (CF) card, a smart media (SM) card, and a memory stick. The storage devices may be also used in the form of solid state drives (SSDs).

To reduce errors during programming, flash memory storage devices may back up least significant bit (LSB) pages paired with respective most significant bit (MSB) pages before programming each of the MSB pages into a flash memory.

SUMMARY

A storage device may include a flash memory and a controller configured to program first bit data and second bit data into the flash memory. When programming the second bit data the controller may be configured to omit a backup operation for the first bit data if a task of programming the first bit data is being executed and may be configured to perform the backup operation for the first bit data if the task of programming the first bit data is not being executed. The first bit data may be less significant bit data than the second bit data.

According to various embodiments, the controller may be configured to determine that the task of programming the first bit data is being executed if a transaction ID of the first bit data is identical to a transaction ID of the second bit data. In various embodiments, the controller may be configured to allocate the transaction IDs of the first bit data and the second bit data to a same transaction, and the transaction may include one or more tasks of programming one or more pieces of data into the flash memory. The tasks included in the transaction may be prioritized and may be processed simultaneously.

According to various embodiments, the controller may be configured to determine that the task of programming the first bit data is being executed if a last confirm flag has not been set for the task of programming the first bit data. The controller may be configured to set the last confirm flag when the task of programming the first bit data is completed.

In various embodiments, the controller may be configured to determine that the task of programming the first bit data is not being executed if a sequence number of the first bit data is not greater than a start sequence number of the task of programming the first bit data. The controller may be configured to update the start sequence number and store the updated start sequence number when the task of programming the first bit data is completed.

A storage device may include a flash memory and a controller configured to program first bit data and second bit data into the flash memory. The controller may be configured to omit backing up the first bit data when programming the first bit data and the second bit data in a same transaction and may be configured to perform backing up the first bit data when programming the first bit data and the second bit data in different transactions. The first bit data may be less significant bit data than the second bit data, each of the transactions may include one or more prioritized tasks, and the tasks included in each of the transactions may be processed simultaneously.

According to various embodiments, if a transaction ID of the first bit data is identical to a transaction ID of the second bit data, the controller may be configured to determine that the first bit data and the second bit data are programmed in the same transaction. A unique transaction ID may be allocated to the transaction, and the controller may be configured to store the transaction ID of the first bit data.

In various embodiments, if the transaction ID of the first bit data is different from the transaction ID of the second bit data, the controller may be configured to determine that the first bit data and the second bit data are programmed in different transactions. A unique transaction ID may be allocated to each of the different transactions, and the controller is configured to store the transaction ID of the first bit data.

In various embodiments, when each of the transactions including the tasks is completed, the controller may be configured to transmit a complete signal to a host.

According to various embodiments, a size of each of the transactions may be determined by at least one of a channel, way, and super block of the flash memory.

A storage device may include a flash memory including a memory cell configured to store a least significant bit (LSB) data and a most significant bit (MSB) data and a controller configured to selectively skip backup of the LSB data when programming the MSB data based on an operational parameter associated with the LSB data.

According to various embodiments, the operational parameter may include a transaction ID of the LSB. The controller may be configured to perform the backup of the LSB data when programming the MSB data if the transaction ID of the LSB data and a transaction ID of the MSB data are different, and may be configured to skip the backup of the LSB data when programming the MSB data if the transaction ID of the LSB data and the transaction ID of the MSB data are equal. The controller may be configured to allocate the transaction IDs to transactions which include programming tasks of the LSB data and the MSB data.

In various embodiments, the operational parameter may further include a sequence number of the LSB data. The controller may be configured to perform the backup of the LSB data when programming the MSB data if the sequence number of the LSB data is smaller than a start sequence number, and may be configured to skip the backup of the LSB data when programming the MSB data if the sequence number of the LSB data is equal to or larger than the start sequence number.

BRIEF DESCRIPTION OF THE DRAWINGS

FIGS. 14 through 23 are diagrams illustrating a program operation of a flash memory according to the method of FIG. 13.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these embodiments are provided so that this disclosure will be thorough and complete, and will fully convey the scope of the invention to those skilled in the art. Like reference numbers refer to like elements throughout.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Figure 1:
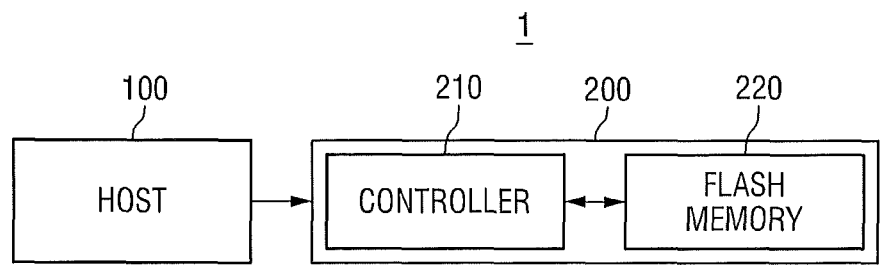
FIG. 1 is a block diagram of a system according to some embodiments of the inventive concept.
Figure 2:
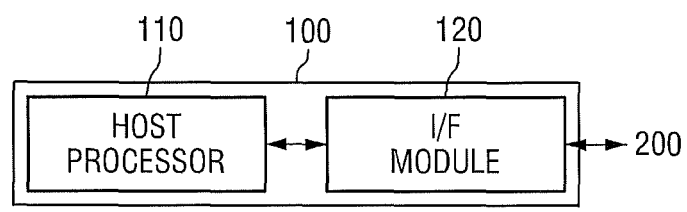
FIG. 2 is a block diagram illustrating an exemplary configuration of a host of FIG. 1.
Figure 3:
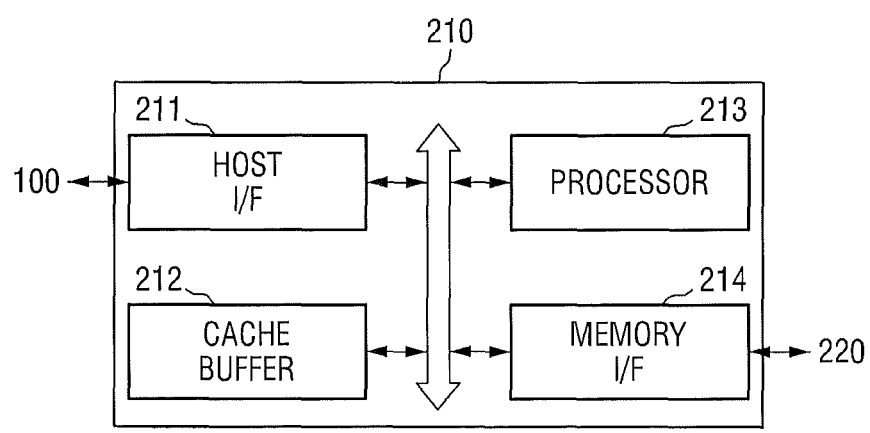
FIG. 3 is a block diagram illustrating an exemplary configuration of a controller of FIG. 1.

FIG. 1 is a block diagram of a system according to some embodiments of the inventive concept. FIG. 2 is a block diagram illustrating an exemplary configuration of a host of FIG. 1. FIG. 3 is a block diagram illustrating an exemplary configuration of a controller of FIG. 1.

Referring to FIG. 1, the system 1 according to some embodiments may include a host 100 and a storage device 200. The storage device 200 may include a flash memory 220 which stores data and the controller 210 which controls the flash memory 220.

The controller 210 is connected to the host 100 and the flash memory 220. The controller 210 is configured to access the flash memory 220 in response to a command from the host 100. For example, the controller 210 may be configured to control read, write, erase or background operations of the flash memory 220. The controller 210 may be configured to provide an interface between the flash memory 220 and the host 100. The controller 210 may be configured to drive a firmware for controlling the flash memory 220.

The flash memory 220 includes one or more memory cells. The flash memory 220 may be a multi-level cell (MLC) flash memory which stores a plurality of bit data in one memory cell. The flash memory 220 may be a NAND flash memory or a NOR flash memory.

First bit data and second bit data may be programmed into one memory cell. For example, the first bit data may be least significant bit (LSB) data, and the second bit data may be most significant bit (MSB) data. In some embodiments, a memory cell is programmed to have one of four states (11, 01, 10 and 11) according to a threshold voltage distribution. According to some embodiments of the present inventive concept, one memory cell may have two bit values. However, the present inventive concept is not limited to, and one memory cell may have three or more bit values.

A memory cell may include an LSB page and an MSB page which share one word line. The flash memory 220 may perform a write operation, a read operation, etc. on a page-by-page basis. The flash memory 220 may program an LSB page into a memory cell and then may program an MSB page into the memory cell in which the LSB page has been programmed.

Referring to FIG. 2, the host 100 may include a host processor 110 and an interface module 120. The host 100 may further include a random access memory (RAM), a read-only memory (ROM), and other components.

The host processor 110 may control the overall operation of the host 100. The host processor 110 may transmit a write command, a read command, an erase command, etc. to the storage device 200 in response to a request from an application. The host processor 110 may transmit data, which is to be written, to the storage device 200.

The interface module 120 is used for communication with a host interface 211 of the storage device 200. The host 100 is configured to communicate with an external device, such as the storage device 200, using at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

Referring to FIG. 3, the controller 210 may include a processor 213, the host interface 211, a cache buffer 212, and a memory interface 214. The host interface 211 may include protocols used to exchange data/commands between the host 100 and the controller 210. The controller 210 is configured to communicate with an external device, such as the host 100, using at least one of various interface protocols, such as a USB protocol, an MMC protocol, a PCI protocol, a PCI-E protocol, an ATA protocol, a serial-ATA protocol, a parallel-ATA protocol, an SCSI protocol, an ESDI protocol, and an IDE protocol.

The memory interface 214 interfaces with the flash memory 220. The memory interface 214 may include a NAND interface or a NOR interface.

The cache buffer 212 may be used as an operation memory of the processor 213, such as a cache memory between the flash memory 220 and the host 100 or a buffer memory between the flash memory 220 and the host 100. The cache buffer 212 may temporarily store data to be written to the flash memory 220 or data read from the flash memory 220. The cache buffer 212 may store a transaction ID of each page which will be described below. The processor 213 may control the overall operation of the controller 210.

The controller 210 may additionally include an error correction block. The error correction block may be configured to detect and correct errors of data read from the flash memory 220 by using error correction code (ECC).

Figure 4:
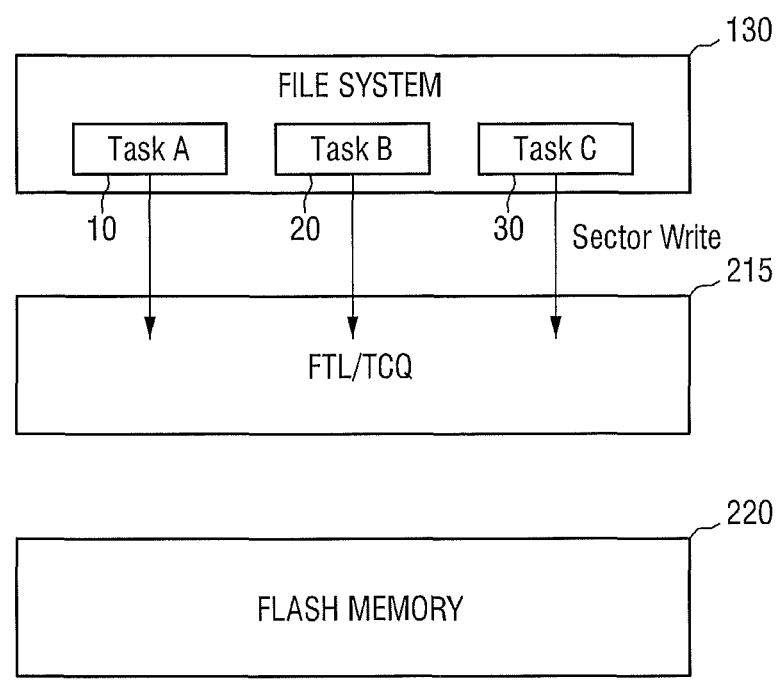
FIGS. 4 through 7 are diagrams illustrating an operation of a system according to some embodiments of the inventive concept.

FIGS. 4 through 7 are diagrams illustrating an operation of a system according to some embodiments of the inventive concept. Referring to FIG. 4, the host 100 has a software layer including a file system 130, and the file system 130 may be driven by the host processor 110. The controller 210 has a software layer including a flash translation layer (FTL)/task command queue (TCQ) 215, and the FTL/TCQ 215 may be driven by the controller 210.

The file system 130 may receive a write request from an application and may transmit data to be written and a sector address to the FTL/TCQ 215. The file system 130 may transmit a plurality of tasks 10 through 30 to the FTL/TCQ 215. Here, a task is a unit of work that accesses the flash memory 220 in response to a command from the host 100. A plurality of data to be written to the flash memory 220 may be grouped into one or more tasks. The file system 130 may prioritize the tasks 10 through 30 and may distinguish the tasks 10 through 30 by allocating a tag (A, B, C, etc.) corresponding to priorities of the tasks 10 through 30.

The FTL/TCQ 215 temporarily stores the tasks 10 through 30 received from the file system 130 in the cache buffer 212 before transmitting the tasks 10 through 30 to the flash memory 220.

Figure 5:
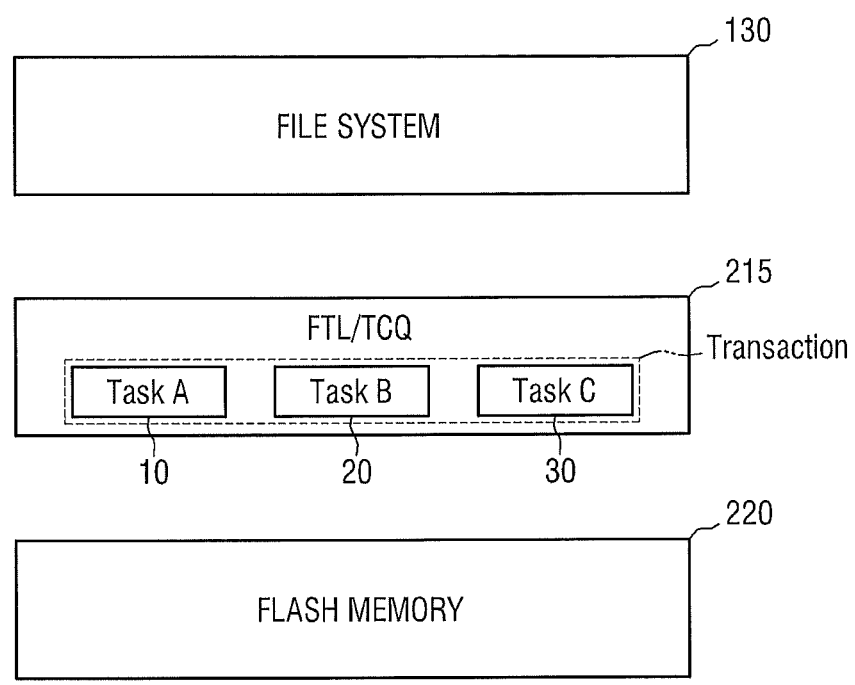

Referring to FIG. 5, the tasks 10 through 30 are arranged in the TCQ of the FTL/TCQ 215. The tasks 10 through 30 arranged in the TCQ may be prioritized again by the controller 210. However, for ease of description it is assumed that the order determined by the file system 130 is maintained.

The tasks 10 through 30 arranged in the TCQ may be executed sequentially according to the priorities. In some embodiments, tasks having the same priority may be executed concurrently. According to some embodiments, tasks that can be executed concurrently may be one transaction, and a unique transaction ID is allocated to that transaction.

Figure 6:
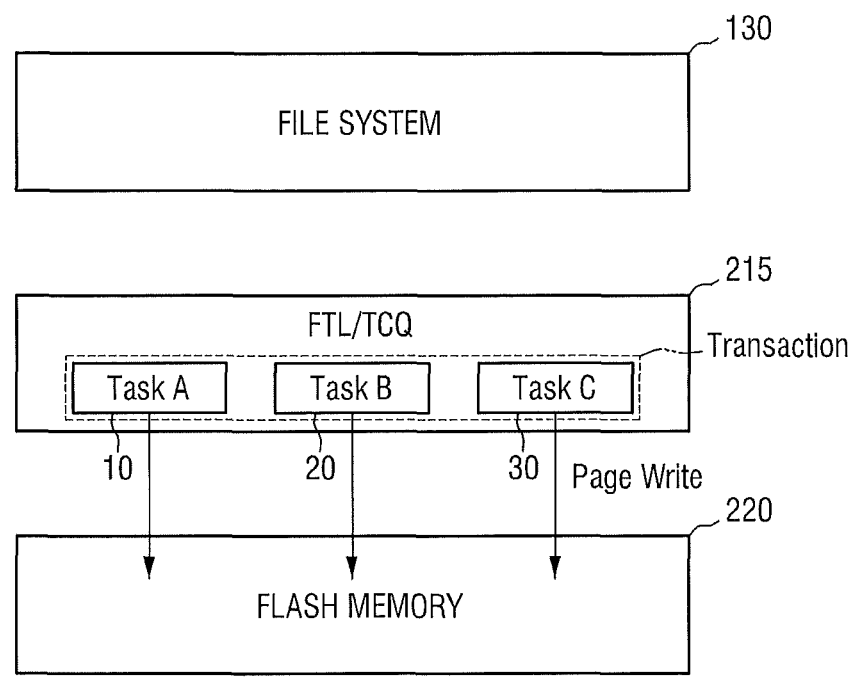

Referring to FIG. 6, the FTL/TCQ 215 transmits data to be written and a page address to the flash memory 220. The FTL/TCQ 215 translates a sector address which is a logical address received from the file system 130 into a page address which is a physical address of the flash memory 220 and transmits the page address. Mapping information between the sector address and the page address may be stored in the cache buffer 212 or the flash memory 220. The FTL/TCQ 215 may sequentially transmit the tasks 10 through 30 according to the priorities or may transmit the tasks 10 through 30 concurrently regardless of the priorities.

Figure 7:
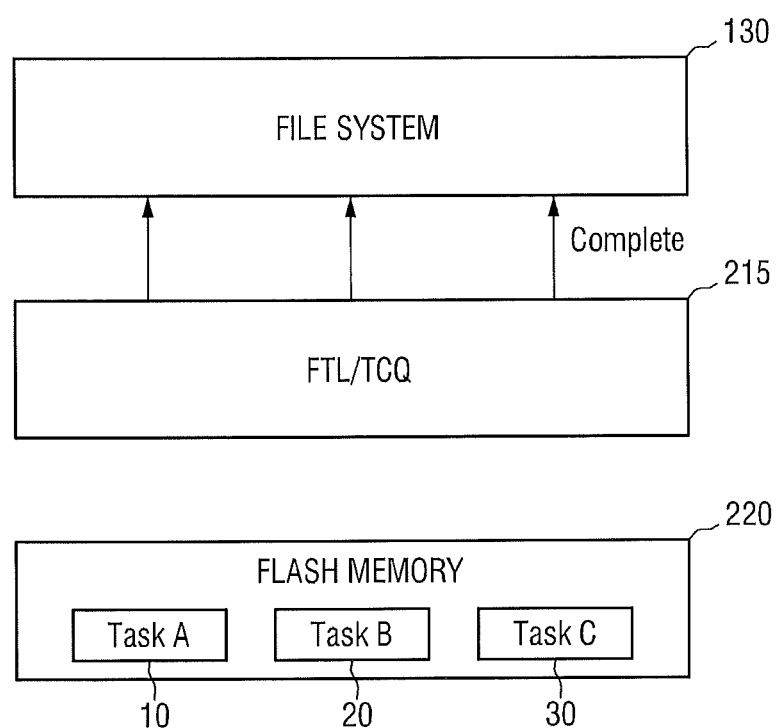

Referring to FIG. 7, after the execution of the tasks 10 through 30 included in one transaction is completed, that is, after the data to be written are all programmed into the flash memory 220, the FTL/TCQ 215 transmits a complete signal Complete to the file system 130. In some embodiments, the FTL/TCQ 215 may transmit the complete signal Complete when the execution of each task is completed.

In the system 1 according to some embodiments, when data is written to the flash memory 220, an LSB page is programmed into a memory cell and then an MSB page is programmed into the memory cell in which the LSB page has been programmed.

When the MSB page is programmed, the state of the LSB page paired with the MSB page may change. Thus, if sudden power off (SPO) occurs, the programmed LSB page can be damaged. To solve this problem, a conventional flash memory storage device backs up an LSB page paired with an MSB page before programming the MSB page and then programs the MSB page. However, if all LSB pages are backed up as described above, the performance of the flash memory storage device may be degraded.

In the system 1 according to some embodiments, the controller 210 may set multiple tasks as one transaction. A transaction is a unit of work including a plurality of tasks that can be processed concurrently. Since some tasks in the TCQ can be processed concurrently as described above, the controller 210 may set the tasks in the TCQ that can be processed concurrently as one transaction.

In some embodiments, when programming an LSB page and an MSB page in the same transaction, the controller 210 may not back up the LSB page. In this case, when the MSB page is programmed, a task of programming the LSB page is being executed. Therefore, there is no need to back up the LSB page.

When programming an LSB page and an MSB page in different transactions, the controller 210 may back up the LSB page. In this case, when the MSB page is programmed, a task of programming the LSB page is not being executed. Therefore, the LSB page should be backed up.

To identify the scope of a transaction, the controller 210 may compare a transaction ID of an LSB page with a transaction ID of an MSB page. To this end, unique transaction IDs are allocated to respective transactions.

A transaction ID of each page programmed into the flash memory 220 may be stored in the cache buffer 212 or the flash memory 220. For example, transaction IDs of LSB pages may be stored in the cache buffer 212.

When programming an MSB page in a first transaction, the controller 210 may determine that the LSB page and the MSB page are programmed in the same transaction if a transaction ID of an LSB page is equal to a transaction ID of the MSB page. Thus, the controller 210 may not back up the LSB page in the first transaction.

On the contrary, if the transaction ID of the LSB page is different from the transaction ID of the MSB page, the controller 210 may determine that the LSB page and the MSB page are programmed in different transactions. Thus, the controller 210 may back up the LSB page in the first transaction.

The controller 210 may calculate a minimum size of a transaction and may determine the number of tasks grouped into one transaction based on the calculated minimum size. For example, the controller 210 may determine the minimum size of a transaction according to the size of a channel, a way or a super block.

The system 1 according to some embodiments may minimize or reduce the number of LSB pages that are backed up and thus may improve the performance of the storage device 200.

Referring back to FIG. 1, the controller 210 and the flash memory 220 may be integrated into one storage device 200. Specifically, the controller 210 and the flash memory 220 may be integrated into one semiconductor device to form a memory card. For example, the controller 210 and the flash memory 220 may be integrated into one semiconductor device to form a multimedia card (e.g., MMC, RS-MMC, MMCmicro), a secure digital (SD) card (e.g., SD, miniSD, microSD, SDHC), a universal flash storage (UFS), a personal computer (PC) card (e.g., Personal Computer Memory Card International Association (PCMCIA)), a compact flash (CF) card, a smart media card (SM, SMC), or a memory stick.

Alternatively, the controller 210 and the flash memory 220 may be integrated into one semiconductor device to form a solid state drive (SSD). The SSD includes a storage device which stores data in a semiconductor memory.

The system 1 may be provided as one of various components of an electronic device such as a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a three-dimensional television, a digital audio recorder, a digital audio player, a digital picture recorder, a digital picture player, a digital video recorder, a digital video player, a device capable of transmitting/receiving information in wireless environments, one of various electronic devices constituting a home network, one of various electronic devices constituting a computer network, one of various electronic devices constituting a telematics network, a radio frequency identification (RFID) device, or one of various components constituting a computing system.

The flash memory 220, the storage device 200, or the system 1 may be packaged using various types of packages. For example, the flash memory 220, the storage device 200, or the system 1 may be packaged using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), and wafer-level processed stack package (WSP).

Figure 8:
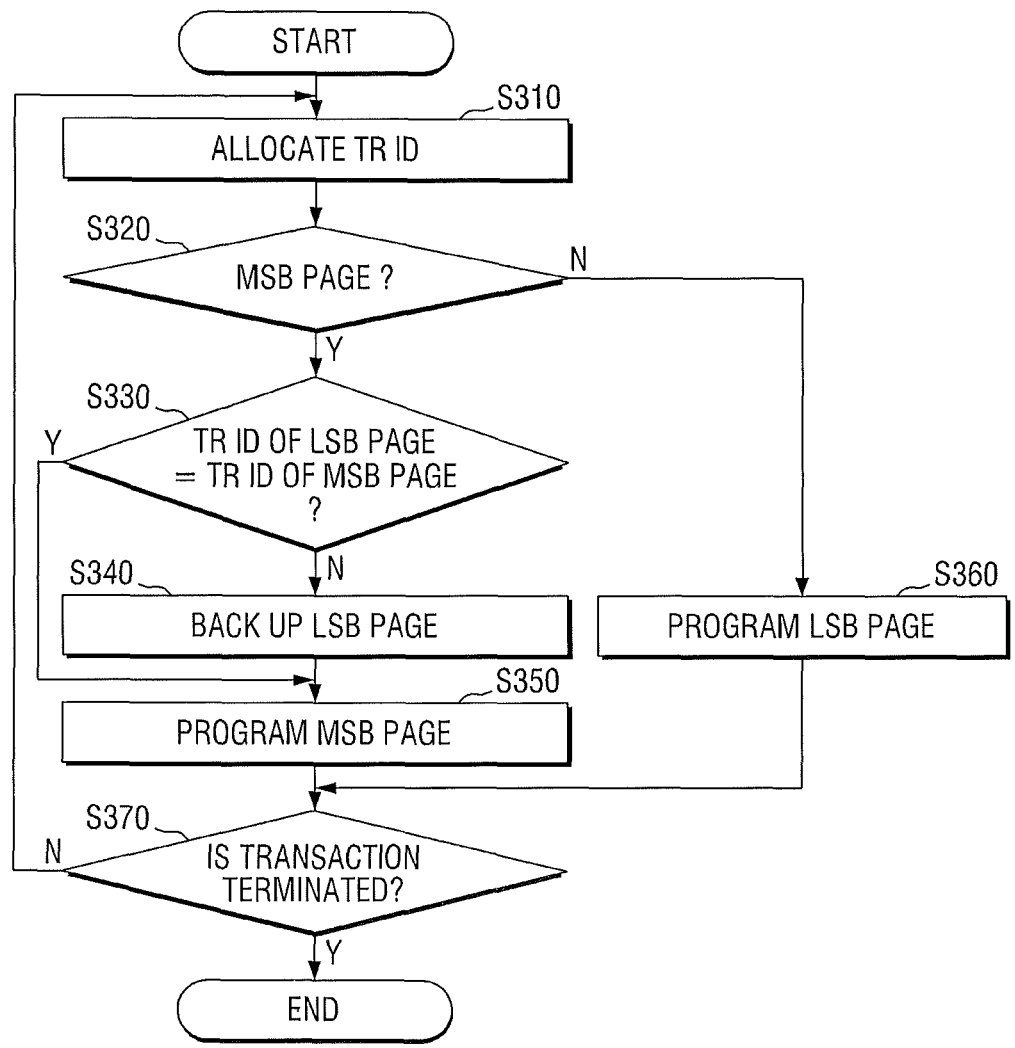
FIG. 8 is a flowchart illustrating a method of operating a system according to some embodiments of the inventive concept.

FIG. 8 is a flowchart illustrating a method of operating a system according to some embodiments of the inventive concept. Referring to FIG. 8, the controller 210 may allocate a transaction ID of a current transaction to a page programmed into the flash memory 220 in the current transaction (operation S310).

Then, the controller 210 may determine whether data to be programmed into the flash memory 220 is an MSB page (operation S320).

If the data to be programmed into the flash memory 220 is the MSB page, the controller 210 may determine whether a transaction ID of the MSB page is identical to a transaction ID of an LSB page paired with the MSB page (operation S330).

If the transaction ID of the MSB page is different from the transaction ID of the LSB page, the controller 210 may back up the LSB page (operation S340). If the transaction ID of the MSB page is identical to the transaction ID of the LSB page, the controller 210 may not back up the LSB page.

The controller 210 may program the MSB page into the flash memory 220 (operation S350). If the data to be programmed into the flash memory 220 is an LSB page, the controller 210 programs the LSB page into the flash memory 220 (operation S360). As described above, an LSB page paired with an MSB page may be programmed before programming the MSB page.

The controller 210 may determine whether the current transaction is terminated (operation S370). If the current transaction is terminated, the controller 210 may terminate the write operation. If the current transaction is not terminated, the write operation may be repeated from operation S310.

Figure 9:
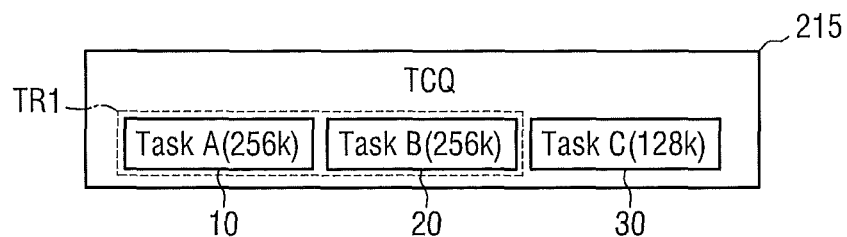
FIGS. 9 through 12 are diagrams illustrating a program operation of a flash memory according to the method of FIG. 8.

FIGS. 9 through 12 are diagrams illustrating a program operation of a flash memory according to the method illustrated in FIG. 8. Referring to FIG. 9, first through third tasks 10 through 30 may be arranged in a TCQ 215. For example, the first task 10 may have a size of 256 Kbytes, the second task 20 may have a size of 256 Kbytes, and the third task 30 may have a size of 128 Kbytes. In some embodiments, a size of a transaction is 512 Kbytes. Accordingly, the first task 10 and the second task 20, which can be processed concurrently, may be set as a first transaction, and a transaction ID "TR1" may be allocated to the first transaction.

The host 100 may transmit data of the first task 10 and the second task 20 to the storage device 200. The first task 10 and the second task 20 may form the first transaction and then be programmed into the flash memory 220.

Figure 10:
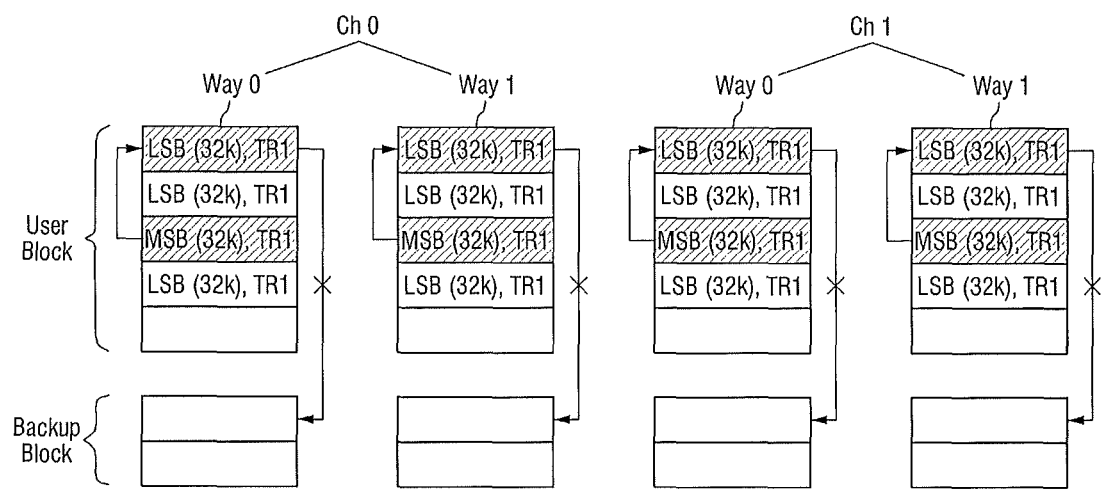

Referring to FIG. 10, the flash memory 220 may include a first block in which LSB and MSB pages are programmed and a second block in which the LSB pages are backed up. For example, the first block may be a user block, and the second block may be a backup block. Each pages of the flash memory 220 may be, for example, 32 Kbytes in size.

As the first task 10 and the second task 20 are executed, LSB and MSB pages of the flash memory 220 are programmed. Here, transaction IDs of each page programmed into the flash memory 220 may be stored in the cache buffer 212.

In FIG. 10, the controller 210 programs four MSB pages in the first transaction. However, since each of the four MSB pages and respective LSB pages paired with each of the four MSB pages have the same transaction ID of "TR1," the controller 210 may not back up the LSB page into the backup block. This is because a task of programming the LSB page is being executed when the MSB page is programmed if an MSB page and an LSB page are programmed in the same transaction.

Figure 11:
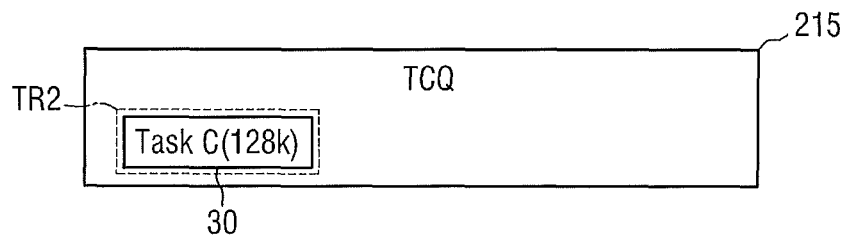

Referring to FIG. 11, after the first task 10 and the second task 20 are completed, only the third task 30 is in the TCQ 215. Accordingly, the third task 30 is set as a second transaction, and a transaction ID "TR2" may be allocated to the second transaction. The host 100 may transmit data of the third task 30 to the storage device 200. The third task 30 may form the second transaction and then be programmed into the flash memory 220.

Figure 12:
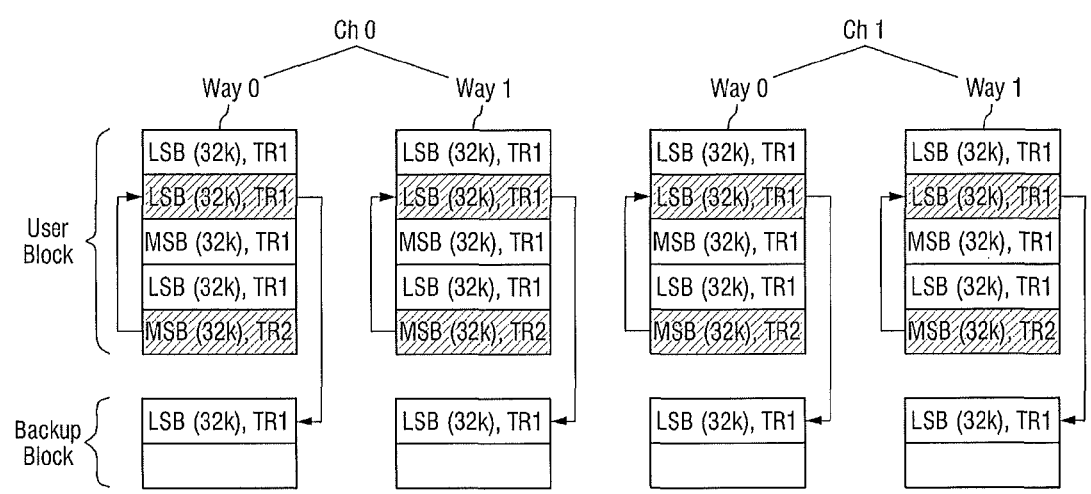

Referring to FIG. 12, as the third task 30 is executed, LSB and MSB pages of the flash memory 220 are programmed.

In FIG. 12, the controller 210 programs four MSB pages in the second transaction. Here, a transaction ID of each of the four MSB pages is "TR2," whereas a transaction ID of an LSB page paired with each of the four MSB pages is "TR1." Therefore, the controller 210 may back up the LSB page into the backup block. This is because if an MSB page and an LSB page are programmed in different transactions, a task of programming the LSB page is not being executed when the MSB page is programmed.

According to some embodiments of the present inventive concept, a last confirm flag may be used to determine whether a task of programming an LSB page is being executed when an MSB page is programmed. After each task is completed, a controller 210 may set the last confirm flag for the task. The controller 210 may not set the last confirm flag before a task is completed.

When programming an MSB page, if the last confirm flag has not been set for a task of programming an LSB page paired with the MSB page, the controller 210 may determine that the task of programming the LSB page is being executed. Therefore, the controller 210 may not back up the LSB page.

On the contrary, if the last confirm flag has been set for the task of programming the LSB page, the controller 210 may determine that the task of programming the LSB page is not being executed. Therefore, the controller 210 may back up the LSB page.

Since the same task tags (A, B, C, . . . ) are repeatedly used, the controller 210 may mistake a last confirm flag of another task for the last confirm flag of the task of programming the LSB page. Accordingly, the controller 210 may additionally compare a sequence number of the LSB page with a start sequence number.

A sequence number is metadata of a page programmed into a flash memory 220. As will be described herein, sequence numbers are allocated to pages programmed into the flash memory 220 in the order of a first way Way 0 of a first channel Ch 0, a first way Way 0 of a second channel Ch1, a second way Way 1 of the first channel Ch0, and a second way Way 1 of the second channel, Ch1. The sequence number of each page may be stored in a cache buffer 212 or the flash memory 220.

The start sequence number may be a sequence number of a page programmed first in each task. A default value or initial value of the start sequence number may be stored as 100.

When programming an MSB page, if a sequence number of an LSB page paired with the MSB page is greater than a start sequence number of a task of programming the LSB page, the controller 210 may determine that the task of programming the LSB page is being executed.

On the contrary, if the sequence number of the LSB page paired with the MSB page is not greater than the start sequence number of the task of programming the LSB page, the controller 210 may determine that the task of programming the LSB page is not being executed.

The system according to some embodiments may minimize or reduce the number of LSB pages that are backed up and may improve the performance of a storage device.

Figure 13:
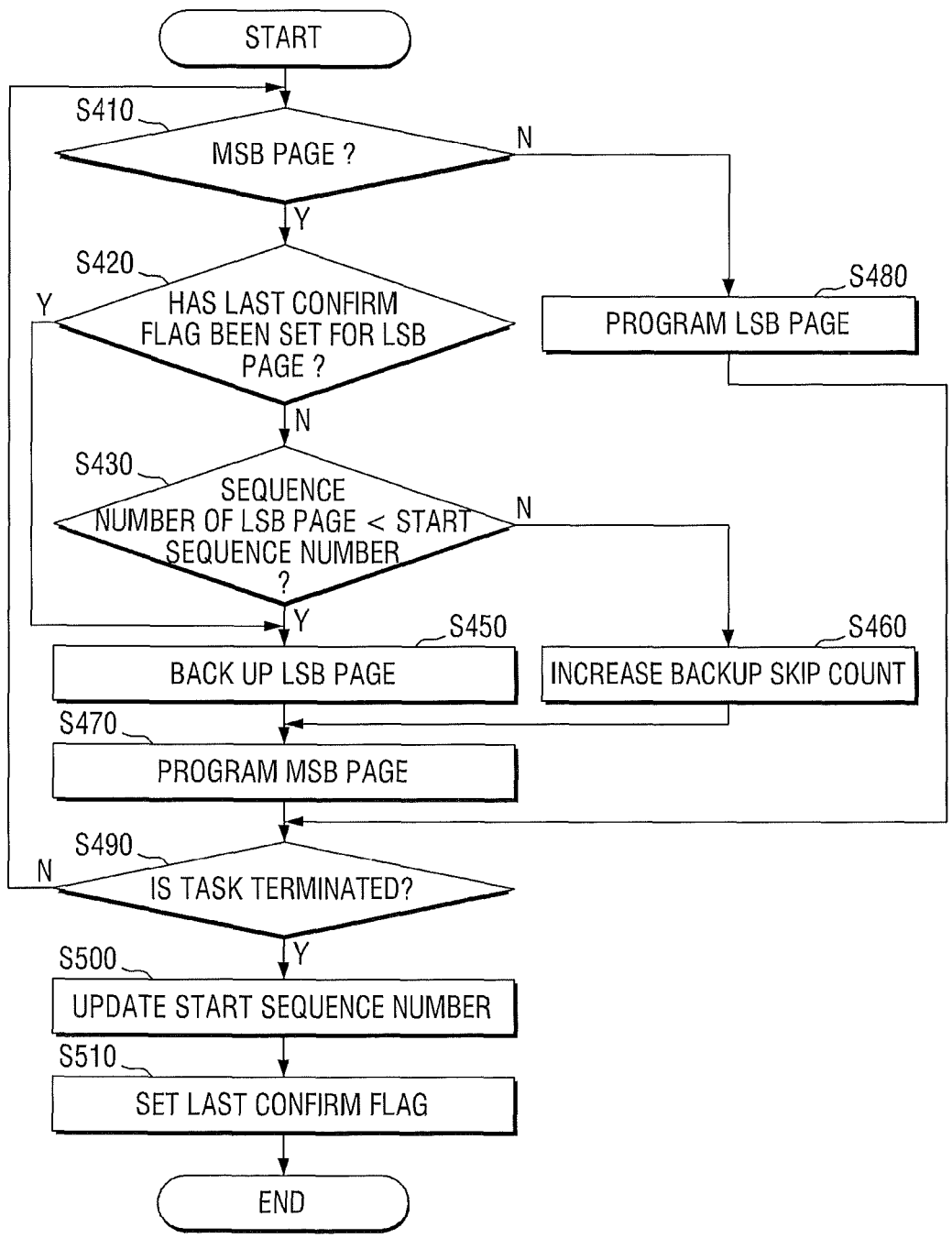
FIG. 13 is a flowchart illustrating a method of operating a system according to some embodiments of the inventive concept.

FIG. 13 is a flowchart illustrating a method of operating a system according to some embodiments of the inventive concept. Referring to FIG. 13, the controller 210 may determine whether data to be programmed into the flash memory 220 in a current task is an MSB page (operation S410).

If the data to be programmed into the flash memory 220 is the MSB page, the controller 210 may determine whether a last confirm flag has been set for an LSB page paired with the MSB page (operation S420).

If the last confirm flag has not been set for the LSB page, the controller 210 may determine whether a sequence number of the LSB page is smaller than a start sequence number (operation S430). If the last confirm flag has been set for the LSB page, the controller 210 may not compare the sequence number of the LSB page with the start sequence number.

If the sequence number of the LSB page is smaller than the start sequence number, the controller 210 may back up the LSB page (operation S450). If the sequence number of the LSB page is not smaller than the start sequence number, the controller 210 may not back up the LSB page and may increase a backup skip count which will be described later (operation S460).

The controller 210 programs the MSB page into the flash memory 220 (operation S470). If the data to be programmed into the flash memory 220 is an LSB page, the controller 210 programs the LSB page into the flash memory 220 (operation S480). As described above, an LSB page paired with an MSB page may be programmed before programming the MSB page.

The controller 210 may determine whether the current task is terminated (operation S490). If the current task is terminated, the controller 210 may update the start sequence number of the current task to a latest sequence number and may store the latest sequence number (operation S500). The latest sequence number may be a largest value among sequence numbers of pages programmed into the flash memory 220 in the current task. The controller 210 may set the last confirm flag for the current task. If the current task is not terminated, the controller 210 may repeat the whole process from operation S410.

FIGS. 14 through 23 are diagrams illustrating a program operation of a flash memory according to the method of FIG. 13. Referring to FIG. 14, first and second tasks 10 and 20 are arranged in the TCQ 215. For example, the first task 10 may have a size of 160 Kbytes, and the second task 20 may have a size of 192 Kbytes. A host 100 may transmit data of the first task 10 and the second task 20 to a storage device 200. The first task 10 and the second task 20 may be programmed into the flash memory 220.

Referring to FIG. 15, an information table for each task may include items, such as a tag (A, B), a backup skip count, a last confirm flag, and a start sequence number. The information table may be stored in the cache buffer 212. The backup skip count may be initialized as "0," and a default value of the last confirm flag may be set as "1." The initial value of the start sequence number may be, for example, 100.

Referring to FIG. 16, as the first task 10 and the second task 20 are executed, LSB pages of the flash memory 220 are programmed. LSB pages (pages with sequence numbers of 201 to 204) in the first task 10 and LSB pages (pages with sequence numbers of 205 to 208) in the second task 20 may be programmed into a user block of the flash memory 220.

Figures 17, 18, 19:
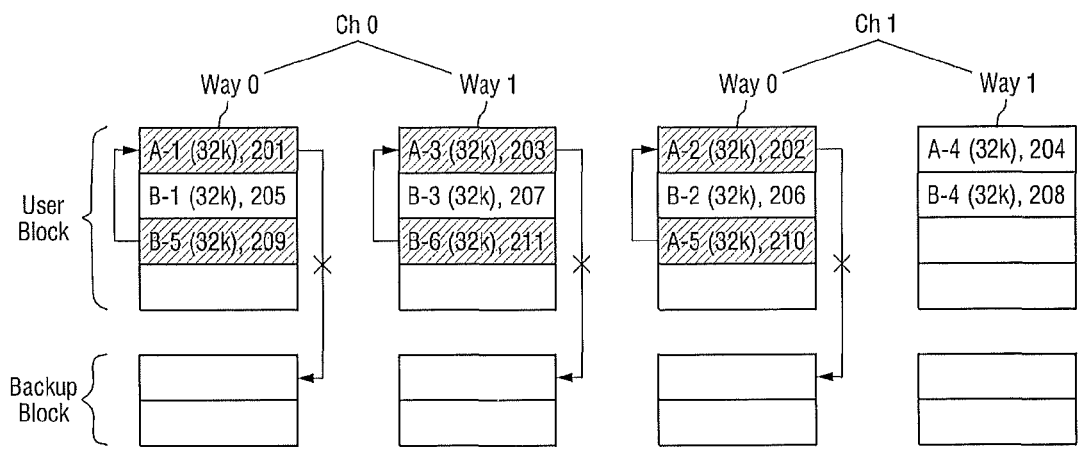

Referring to FIG. 17, as the first task 10 and the second task 20 begin, the controller 210 does not set the last confirm flag of the information table, that is, the controller 210 may set the last confirm flag as "0". In addition, a start sequence number of the first task 10 is stored as 201, and a start sequence number of the second task 20 is stored as 205.

Referring to FIG. 18, as the first task 10 and the second task 20 continue, MSB pages of the flash memory 220 are programmed. MSB pages (pages with sequence numbers of 209 and 211) in the first task 10 and an MSB page (a page with a sequence number of 210) in the second task 20 may be programmed into the user block of the flash memory 220.

Since the last confirm flag has not been set for the first task 10 of programming the LSB pages paired with the MSB pages, that is the last confirm flag is "0", and the sequence numbers "201 through 203" of the LSB pages are not smaller than the start sequence number "201," the controller 210 may not back up the LSB pages. The controller 210 may store information about the LSB pages, which are not backed up, in connection with the MSB pages. In the information table, the controller 210 may increase the backup skip count of the first task 10 of programming the LSB pages in proportion to a number of LSB pages which are not backed up.

Referring to FIG. 19, since the controller 210 did not back up the pages with the sequence numbers of 201 through 203 when programming the MSB pages, it increases the backup skip count of the first task 10 to "3" and stores "3."

Referring to FIG. 20, information about pages processed in the TCQ 215 may be stored in a done queue 216. As shown in FIG. 20, even if a "B-5" page is requested to be programmed first, an "A-5" page may be programmed first.

Even if the programming of the "A-5" page is completed in the first task 10, the controller 210 may have the "A-5" page waiting without transmitting a complete signal to the host 100. This is because the second task 20 of programming the MSB pages paired with the LSB pages, which were not backed up in the first task 10, has not been completed. To this end, the controller 210 may check whether the backup skip count of the first task 10 is "0" and may transmit the complete signal to the host 100 only when the backup skip count of the first task 10 is "0."

The controller 210 has the "A-5" page waiting in the done queue 216 and dequeues "B-5" and "B-6" pages first. Referring to FIG. 21, the controller 210 may reduce the backup skip count (i.e., the number of LSB pages that were not backed up) of the first task 10 to "1" because "B-5" and "B-6" pages were dequeued from the done queue 216. Accordingly, the controller 210 may transmit a complete signal of the second task 20 to the host 100. Since the second task 20 has been completed, the controller 210 may set the last confirm flag for the second task 20 as "1" in the information table. In addition, the controller 210 may update the start sequence number of the second task 20 as the latest sequence number "211" and stores "211."

Referring to FIG. 22, the controller 210 may dequeue the "A-5" page from the done queue 216. Then, referring to FIG. 23, the controller 210 may reduce the backup skip count (i.e., the number of LSB pages that are not backed up) of the first task 10 to "0" because "A-5" page was dequeued from the done queue 216. Since the backup skip count of the first task 10 is "0," the controller 210 may transmit a complete signal of the first task 10 to the host 100.

Since the first task 10 has been completed, the controller 210 may set the last confirm flag for the first task 10 as "1" in the information table. In addition, the controller 210 updates the start sequence number of the first task 10 as the latest sequence number "210" and stores "210."

Steps of a method or algorithm described in connection with the aspects disclosed herein may be embodied in hardware, in a software module executed by a processor, or in a combination of thereof. A software module may reside in a RAM, a flash memory, a ROM, an electrically programmable ROM (EPROM), an electrically erasable programmable ROM (EEPROM), a register, a hard disk, a removable disk, a CD-ROM, or any other form of computer-readable recording medium known in the art. An exemplary recording medium may be coupled to a processor such that the processor can read information from and write information to the recording medium. An exemplary recording medium may be integral to the processor. The processor and the storage medium may reside in an application specific integrated circuit (ASIC). The ASIC may reside in an user equipment. In the alternative, the processor and the storage medium may reside, as discrete components, in an user equipment.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A storage device, comprising:
a flash memory; and
a controller configured to program first bit data and second bit data into the flash memory, wherein when programming the second bit data the controller is configured to omit a backup operation for the first bit data if a task of programming the first bit data is being executed and is configured to perform the backup operation for the first bit data if the task of programming the first bit data is not being executed,
wherein the first bit data is less significant bit data than the second bit data, and
wherein the controller is configured to determine that the task of programming the first bit data is not being executed if a sequence number of the first bit data is not greater than a start sequence number of the task of programming the first bit data.

2. The storage device of claim 1, wherein the controller is configured to determine that the task of programming the first bit data is being executed if a last confirm flag has not been set for the task of programming the first bit data.

3. The storage device of claim 2, wherein the controller is configured to set the last confirm flag when the task of programming the first bit data is completed.

4. The storage device of claim 1, wherein the controller is configured to update the start sequence number and store the updated start sequence number when the task of programming the first bit data is completed.

5. A storage device, comprising:
a flash memory; and
a controller configured to program first bit data and second bit data into the flash memory, wherein the controller is configured to omit backing up the first bit data when programming the first bit data and the second bit data in a same transaction and is configured to perform backing up the first bit data when programming the first bit data and the second bit data in different transactions, and
wherein the first bit data is less significant bit data than the second bit data, each of the transactions comprises one or more prioritized tasks, and the tasks included in each of the transactions can be processed simultaneously.

6. The storage device of claim 5, wherein if a transaction ID of the first bit data is identical to a transaction ID of the second bit data, the controller is configured to determine that the first bit data and the second bit data are programmed in the same transaction.

7. The storage device of claim 6, wherein a unique transaction ID is allocated to the transaction, and the controller is configured to store the transaction ID of the first bit data.

8. The storage device of claim 5, wherein if a transaction ID of the first bit data is different from a transaction ID of the second bit data, the controller is configured to determine that the first bit data and the second bit data are programmed in different transactions.

9. The storage device of claim 8, wherein a unique transaction ID is allocated to each of the different transactions, and the controller is configured to store the transaction ID of the first bit data.

10. The storage device of claim 5, wherein when each of the transactions which comprises the tasks is completed, the controller is configured to transmit a complete signal to a host.

11. The storage device of claim 5, wherein a size of each of the transactions is determined by at least one of a channel, way, and super block of the flash memory.

12. A storage device, comprising:
a flash memory comprising a memory cell configured to store a least significant bit (LSB) data and a most significant bit (MSB) data; and
a controller configured to selectively skip backup of the LSB data when programming the MSB data based on an operational parameter associated with the LSB data, wherein the operational parameter comprises a last confirm flag configured to indicate whether a programming task of the LSB data is completed, and
wherein the controller is configured to perform the backup of the LSB data when programming the MSB data if the last confirm flag indicates that the programming task of the LSB data is completed.

13. The storage device of claim 12, wherein:
the operational parameter further comprises a sequence number of the LSB data; and
the controller is configured to perform the backup of the LSB data when programming the MSB data if the sequence number of the LSB data is smaller than a start sequence number, and is configured to skip the backup of the LSB data when programming the MSB data if the sequence number of the LSB data is equal to or larger than the start sequence number.

14. The storage device of claim 13, wherein the controller is configured to update the start sequence number and store the updated start sequence number when the programming task of the LSB data is completed.

15. The storage device of claim 12, wherein the controller is configured to set the last confirm flag when the programming task of the LSB data is completed.

16. The storage device of claim 15, wherein the controller is configured to determine that the programming task of the LSB data is completed if the last confirm flag has been set for the programming task of the LSB data.

* * * * *